United States Patent [19]

Greiff

[11] 4,067,037
[45] Jan. 3, 1978

[54] TRANSISTOR HAVING HIGH $F_t$ AT LOW CURRENTS
[75] Inventor: Paul Greiff, Wayland, Mass.
[73] Assignee: Massachusetts Institute of Technology, Cambridge, Mass.
[21] Appl. No.: 676,019
[22] Filed: Apr. 12, 1976
[51] Int. Cl.² ............... H01L 29/72; H01L 27/02; H01L 27/12
[52] U.S. Cl. .................... 357/34; 357/35; 357/36; 357/47; 357/49
[58] Field of Search ............ 357/34, 35, 36, 49
[56] References Cited
U.S. PATENT DOCUMENTS

| | | | |
|---|---|---|---|
| 3,409,482 | 11/1968 | Lindmayer et al. | 357/34 |
| 3,455,748 | 7/1969 | Lindmayer et al. | 357/34 |
| 3,458,367 | 7/1969 | Yasufuku | 357/34 |
| 3,717,507 | 2/1973 | Abe | 357/34 |
| 3,943,014 | 3/1976 | Yoshizawa | 357/34 |

OTHER PUBLICATIONS

Radiation-Tolerant Silicon Transistor, by Lauritzen, Nov. 1964, pp. 39-46.
Microwave Transistor; by Katori et al.; Fujitsu Scientific & Technical Journal; Sept. 1972; pp. 153-175.

Primary Examiner—Andrew J. James
Attorney, Agent, or Firm—Arthur A. Smith, Jr.; Martin M. Santa; Robert Shaw

[57] ABSTRACT

A transistor structure capable of high frequency operation with low collector currents is obtained by fabricating the transistor using nitride techniques to minimize the emitter area and base width area beyond that obtainable by conventional masking techniques. The emitter is surrounded on three sides by low capacitance dielectric which reduces its emitter-to-collector capacitance and hence improves high frequency performance.

3 Claims, 22 Drawing Figures

TRANSISTOR HAVING HIGH $F_T$ AT LOW CURRENTS

The Government has rights in this invention pursuant to Contract No. F19(628)-76-C-0002 awarded by the United States Air Force.

This invention relates to a transistor and its method of fabrication and in particular to a transistor which has a high $f_T$ at low currents.

BACKGROUND OF THE INVENTION

As integrated circuits become more complex and are pushed to their highest operating speeds there is a growing concern for power dissipation. The resultant design is usually based on a trade off in the speed-power product characteristic of a given technology. Two major factors limit the speed product of present ECL circuits, isolation capacitance and high frequency performance at low collector current. Isolation capacitance has recently been minimized with the introduction of various sidewall isolation schemes by others. This invention produces excellent high frequency performance at low collector currents.

Magdo and Magdo, International Electric Devices Meeting, Dec. 9-11, 1974, Technical Digest, pp. 276-278, have obtained a full size 0.1 × 0.1 mil emitter using an overlap technique within a conventional base structure. Because there is outward diffusion rather than reduction of area in the processing, the finished devise has an emitter area approximately three times larger than the micro-emitter of this invention.

H. Kamioka et al, op. cit., pp. 279-282, have obtained very small emitter area by minimizing stripe width on a conventional base structure. For low current operation the conventional base has the disadvantage of a large parasitic collectorbase capacitance which reduces the low current $f_T$.

SUMMARY OF THE INVENTION

Prior art transistor design rules call for an emitter geometry which maximizes ratio of the periphery of the emitter to its area. This criteria results in an emitter which takes the form of a long, narrow stripe. The stripe width is minimized because the most effective part of the emitter is at its edges. The remainder of the emitter area contributes toward the undesirable emitter to base capacitance. Typical of these prior art transistors are the Q12, Q22, and Q31 configurations shown in FIG. 1 where the shaded region 100 represents the mask for the emitter region, the double cross-hatched region 101 represents the mask for the base contact region, and the clear area 102 and the area under regions 100, 101 represents the base region. The technology has been proceeding in the direction of reducing the width of the emitter as seen from the progressively smaller size of transistor Q12, Q22, and Q31. The characteristics of the transistors are shown in Table 1 and in FIGS. 3 and 4. It is seen that higher values of $f_T$ at lower collector currents is obtained with decrease in size. The smallest of these prior art transistors Q31 represented the limit of smallness which was attainable by the isoplanar process used for its fabrication.

The transistor of this invention has an emitter which is approximately square in dimension and is of such small dimension that almost all of the emitter is effective rather than just the edges as in the prior art. The process for making the emitter also eliminates a critically important parasitic capacitance.

The results obtained with this invention are completely unexpected in view of the prior art design rules because the emitter constructed according to the teachings of this invention has one edge in contact with the base and, therefore, seemingly minimizes the effective periphery of the emitter. In addition, a new phenomenon has been observed whereby a low rate of $f_T$ fall-off at higher currents is achieved. This phenomena may be caused by the emitter being small enough to act like a point source of current injection instead of an area source as in the prior art. The significant advantage of a point source is that edge effects which reduce the current density represent a significant fraction of the emitter current. In contrast for an area source, edge effects produce negligible contributions to the total emitter current.

The invention described here has as its object the increase of transistor $f_T$ at low currents. A geometry and processing technique is described which yields a class of transistors with extremely low emitter and base capacitance. These capacitances have been reduced by from one third to one tenth of those previously reported. A most interesting characteristic of these devices is that $f_T$ remains at a high value over a current range from 20 μA to 1mA. $f_T$ is defined as the highest frequency at a given collector current at which the ratio of collector current to base current is at least unity.

A good representation of $f_T$ at low currents is:

$$1/2\pi f_T = r_E' [C_{TE} + C_{TC}] + 1/2\pi f_{T_{max}}$$

where $r_E' = kT/qI_c$ = dynamic resistance of the emitter diode
$C_{TE}$ = emitter-base transition capacitance
$C_{TC}$ = collector-base transition capacitance
$f_{T_{max}}$ = the peak $f_T$ as limited by time constants relatively independent of current In order to get higher $f_T$ values, it is necessary to reduce the emitter-to-base capacitance and the collector-to-base capacitance.

Very small emitter and collector-to-base capacitances are achieved in this invention by utilizing state-of-the-art technology in an unobvious way. The collector-to-base capacitance is reduced by making the base width as narrow as conventional photolithography techniques allow, in the embodiment of the invention disclosed herein, this was 0.1 mil. The length of the base is also kept to a minimum as determined by the necessity for an emitter region, a base contact region and a space therebetween, keeping in perspective the tolerance requirements in the different masking operation to produce these regions. In conjunction with the small base area, the emitter-to-base capacitance is reduced by making the emitter area as small as lithographically feasible and preferably locating the emitter area at the very end of the base area. In addition to having the areas as defined by photolithographic techniques as small as possible, the process used in making the device of this invention further reduces these areas. The process used is the nitride process commonly used in fabricating large area semiconductor devices. Whereas in prior art large area devices the area reduction produced by the nitride process is negligible and does not result in a change in performance of the device, in the invention herein described, the area reduction is significant in view of the small initial areas and substantial improvement in device operation results.

The emitter-to-base capacitance is not only a function of the area of the emitter but is also determined by the base profile presented to the emitter. In conventional construction where the large emitter is surrounded by the base, the capacitance is largely determined by the area of the emitter and the side walls contribute little capacitance. As the area decreases, the side walls of the emitter become significant contributing factors to the overall capacitance of the emitter. These side wall effects are minimized in the present invention by using the nitride process to produce oxide on three sides of the emitter area in the preferred embodiment, thus allowing only one side wall of the emitter to be in contact with the base. Thus, not only is the small area of the emitter reduced by the nitriding process but also only one side wall of the emitter contributes to the emitter-to-base capacitance. Attempts by others to make small area emitters failed to accomplish the desired result because their techniques for producing the emitter region caused the area to spread by diffusion under the oxide etc., and further the side walls became larger and contributed to the emitter-to-base capacitance.

The value of $f_T$ is also a function of the dynamic resistance $r_E'$ of the emitter diode, the value of $f_T$ decreasing inversely with an increase of $r_E'$. Since $r_E'$ is in turn a function of collector current, increasing inversely with collector current in accordance with the equation $r_E' = kT/qI_C$ $r_E'$ increases with a decrease of collector current, which in turn results in a decrease of $f_T$. Therefore, in order to keep $f_T$ from falling off quickly for low collector currents, it is necessary that the reduction in the capacitances referred to in the preceding paragraphs be substantial, which they are in applicant's invention.

A further desirable characteristic of the transistor of this invention is its behavior at high collector currents where $f_T$ also begins to decrease because of the current density limitation in the region under the emitter. For a large area emitter, the current is largely carried by the area under emitter with only a relatively small contribution from current spreadings effects at the side walls of the emitter. At some maximum current density, dependent on collector doping, the base will rapidly spread into the collector producing a correspondingly rapid decrease in $f_T$ as is found in prior art transistor configurations. In contrast, the fall-off of $f_T$ for high collector currents is much more gradual in the case of applicant's invention. It is believed that the small emitter area of applicant's transistor is responsible for this more gradual fall-off since current spreading at the side-walls of the emitter has a much greater effect on current density when the emitter area is small as in applicant's invention as compared to a large area emitter as in the prior art.

The process used in these experiments combines silicon nitride processing with its selective oxidation and etching to minimize the base area and an overlap method of forming very small emitter geometries with conventional photomask tolerances. A similar technique has been described by Magdo and Magdo op cit, but with some very important distinctions from applicant's invention, as will be apparent from the following description.

Devices made in accordance with this invention can be used to obtain about an order of magnitude improvement in prior art ECL speed power product.

DETAILED DESCRIPTION OF THE INVENTION

Figure 1:
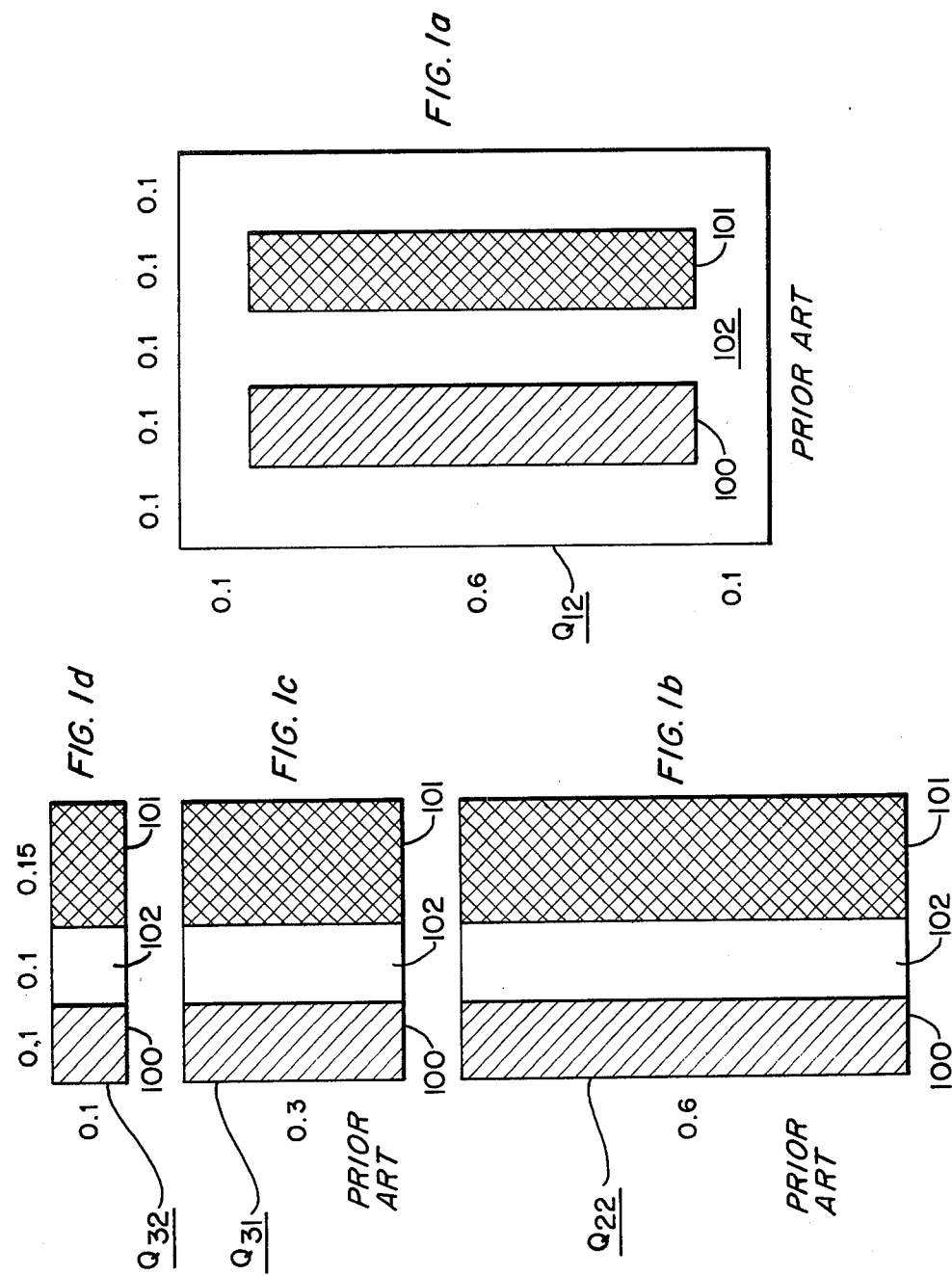
FIG. 1 (a)-(d) shows the mask dimensions used for fabricating the various transistor geometries including that of the proposed embodiment.

In order to demonstrate the unobvious advantages of the invention over the prior art, various mask geometries as shown in FIG. 1 were used to fabricate transistors under constant processing conditions which then were compared. Devices ranged from a small conventional prior art structure, Q12, FIG. 1(a), through structures similar to those used in experimental isoplanar circuits, Q22 FIG. 1(b), and Q31, FIG. 1(b), to the smallest structure, Q32, FIG. 1(d), comprising the invention which will be referred to as a micro-emitter. Dimensions are shown in mils. The shaded area represents the emitter opening in a mask.

Figure 2:
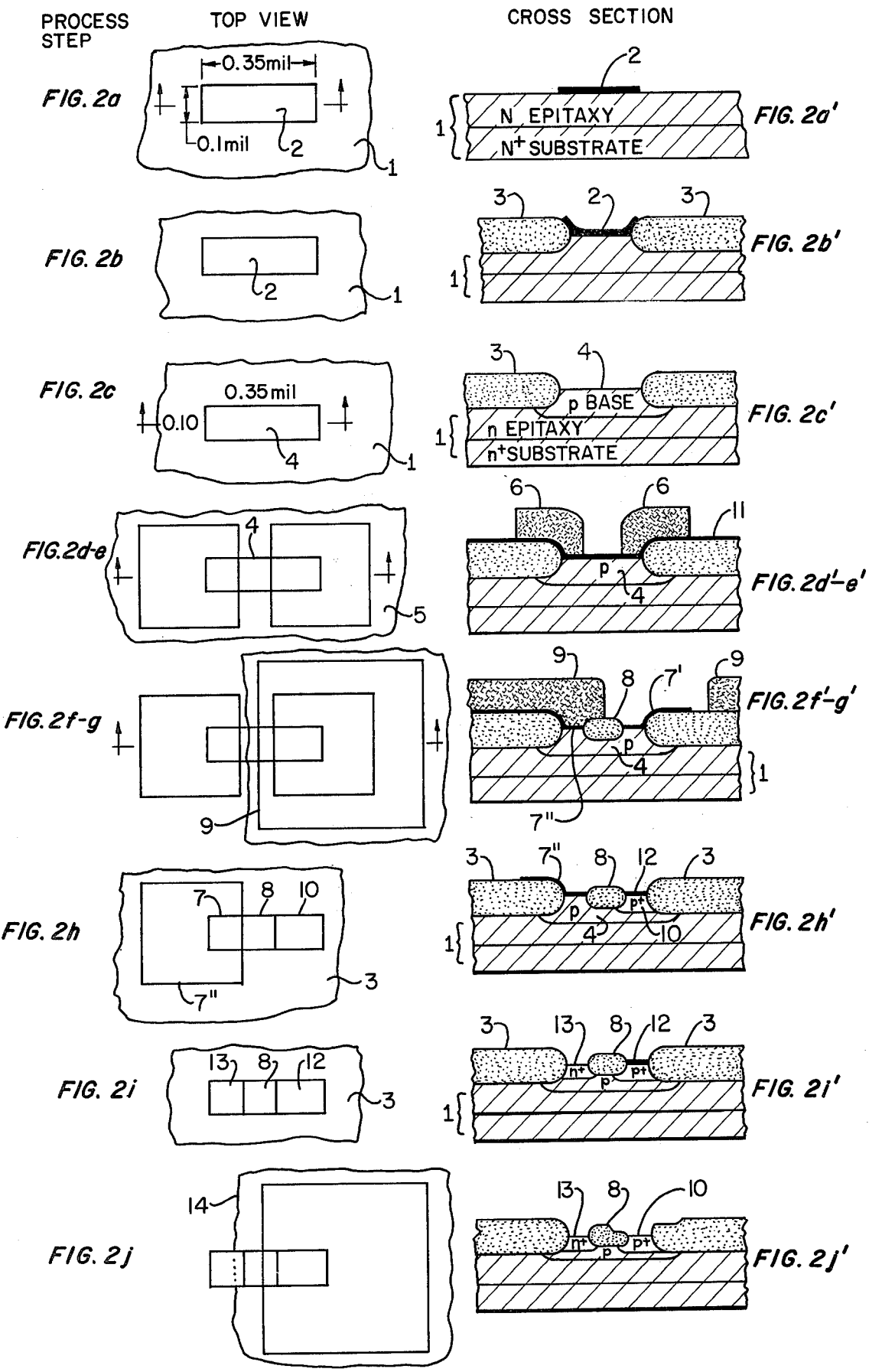
FIG. 2 (a)-(j) shows the processing sequence for diffused emitters in topological view and lengthwise cross section.

The processing details for a diffused emitter are illustrated in FIG. 2 for the mask configuration Q32, and a corresponding step by step procedure is detailed below. The other comparative geometries are contained on the same mask and are, therefore, processed at the same time on the same substrate. For the sake of simplicity the starting material was N/N+ epitaxial silicon. There is only small performance differences between N/N+ epitaxy and a buried layer device.

PROCESS DESCRIPTION

Process Step a. FIGS. 2(a), 2(a'). Silicon nitride is deposited on the wafer by conventional technique. Silicon dioxide is next deposited on the nitride. Conventional photolithography and etching are then used to leave the desired pattern in the top layer of oxide. (Where transistor Q32 is being fabricated, this pattern is a 0.1 × 0.35 mil line.) The oxide pattern is then used as a mask to allow etching of the nitride in hot phosphoric acid which dissolves ordinary resists. The oxide mask is removed by conventional techniques leaving a 0.1 × 0.35 mil nitride pad 2. In all subsequent processing steps where the nitride is described as being a patterned deposition, the above conventional processing steps are implied.

b. FIGS. 2(b), 2(b'). A 1 μ thick oxide layer 3 is grown on wafer 1 by thermal oxidation at 1100° C. The oxide layer 3 grows underneath and lifts the nitride pad 2 at its edges to thereby reduce the size of the opening under the pad.

c. FIGS. 2(c), 2(c'). The nitride layer 2 is stripped and the base 4 is diffused into the resultant window by conventional diffusion techniques. Typical sheet resistivity is 800Ω/□, collector-base junction depth is 0.7μ. Only a thin oxide is grown during the base diffusion and it is conventionally removed without photolithography before the next step.

d. FIGS. 2(d-e), 2(d'-e'). A second nitride oxide-layer 11 is deposited.

e. FIGS. 2(*d–e*), 2(*d'–e'*). The process of step "*a*" is used with an oversized self-aligned mask 5 applied as shown leaving two photoresist pads 6 from which two nitride pads 7 are obtained. Later, under one pad will be the emitter; and under the other, the base contact.

f. FIGS. 2(*fg*), (2*f'g'*). A 3000A oxide layer 8 is thermally grown between the nitride pads 7.

g. FIGS. 2(*fg*), 2(*f'g'*). The wafer is coated with silicon dioxide which is photolithographically etched and used as mask for etching the nitride 7' as in step "*a*". The oversized resist window mask 9 is used to etch a window in the dioxide and expose the base contact nitride pad 7' which is then selectively etched in hot phosphoric acid as explained in step "*a*" to expose the base. The silicon dioxide coating which was used as a photolithographic mask is next removed.

h. FIGS. 2(*h*), 2(*h'*). A shallow P+ contact 10 diffusion is performed during which a thin 1500A oxide layer 12 is grown.

i. FIGS. 2(*i*), 2(*i'*). The remaining nitride pad 7" is removed by phosphoric acid and the emitter 13 is diffused into the resultant "window". Phosphorous doped glass is used as the source and a sheet resistivity of 50 $\Omega/\square$ is obtained. Typical emitter depth is $0.5\mu$ and the basewidth is $0.3\mu$.

j. FIGS. 2(*i*), 2(*i'*). An oversize mask 14 is applied as shown and the base contact 10 is reopened. The large difference in oxide thickness between the thin base contact oxide 12 and the thick external oxide 3 allows the use of an oversized mask.

k. The wafer is then metallized and patterned, as conventionally done. The metallization is a sputtered aluminum — 2% silicon — 4% copper alloy. This step is not shown in FIG. 2.

Devices were also fabricated using ion implantation. The processing differed considerably after step *b*. However, emitter and base topological dimensions did not change. The P+ contact area extends to the edge of the emitter window forming an external base handle and reducing $r_b'$. Both the active base and emitter are then implanted through the same oxide window. An arsenic emitter was implanted first at 30 keV and a dose of 3 × $10^{15}$ ions/cm². After annealing, boron was implanted at 60 keV and 1 × $10^{13}$ ions/cm².

Figure 3:
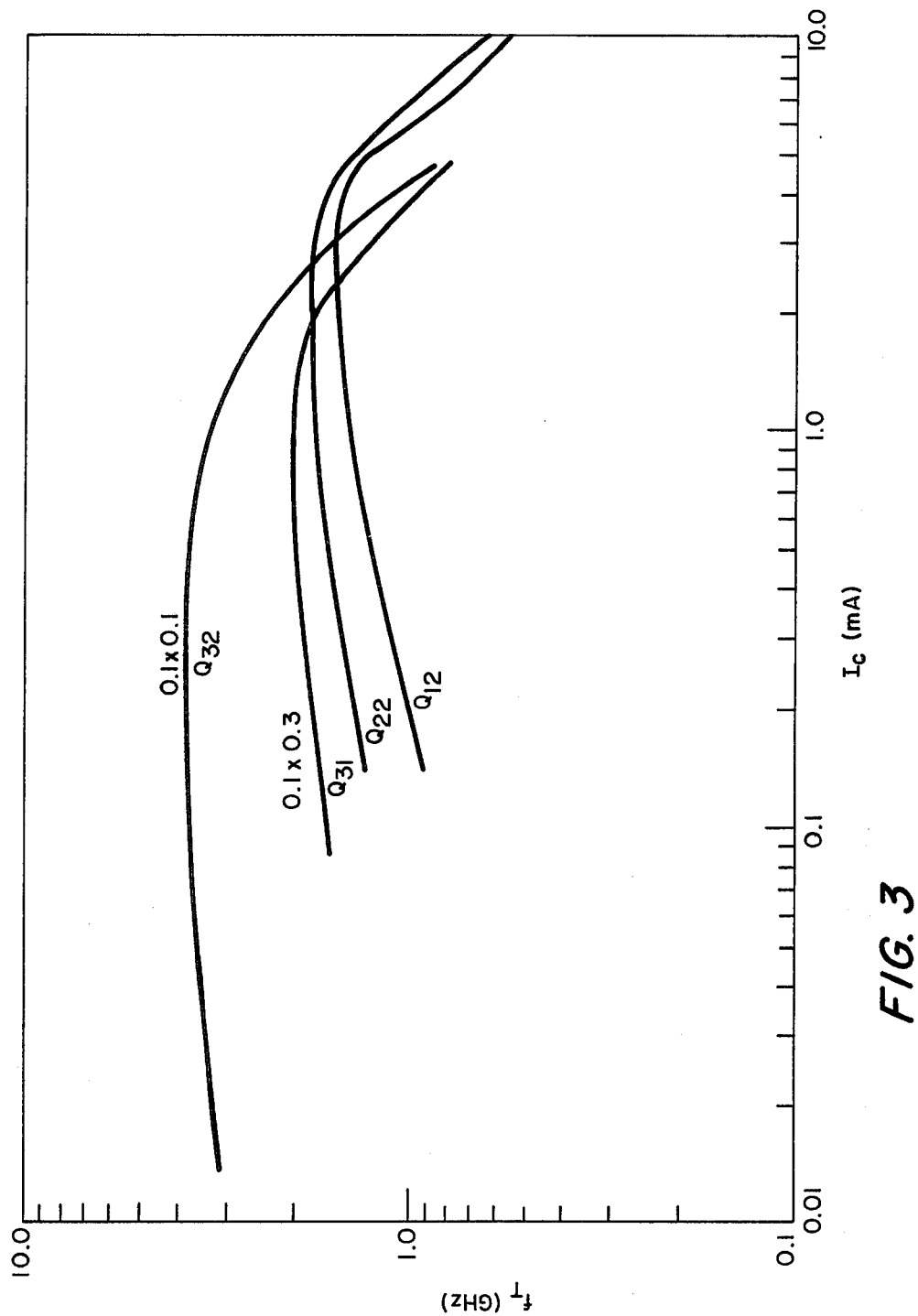
FIG. 3 is a plot of cutoff frequency, $f_T$, as a function of collector current, $I_c$, for the diffusion process.

The individual transistors were mounted in insulated-collector four-lead TO-18 packages to facilitate tuning out package and bonding pad capacitance for the $f_T$ measurements. Comparative $f_T$ measurements for the four geometries of FIG. 1 are shown in FIG. 3 for a diffused run and in FIG. 4 for an ion implanted run. The epi layer of the diffused run was $4\mu$ thick and had 0.5 ohm-cm resistivity. The data of FIG. 3 was taken with zero volts collector-base basis at a measurement frequency of 400MHz. The results for the diffused emitter, Q32, suggest the following:

1. An optimum has been obtained whereby $f_T$ is almost independent of current over the range 20 $\mu$ A to 1 mA.

2. The device capacitance has been reduced by a considerable greater amount than that indicated by the nominal dimensions and mask areas of FIG. 1.

Figure 4:
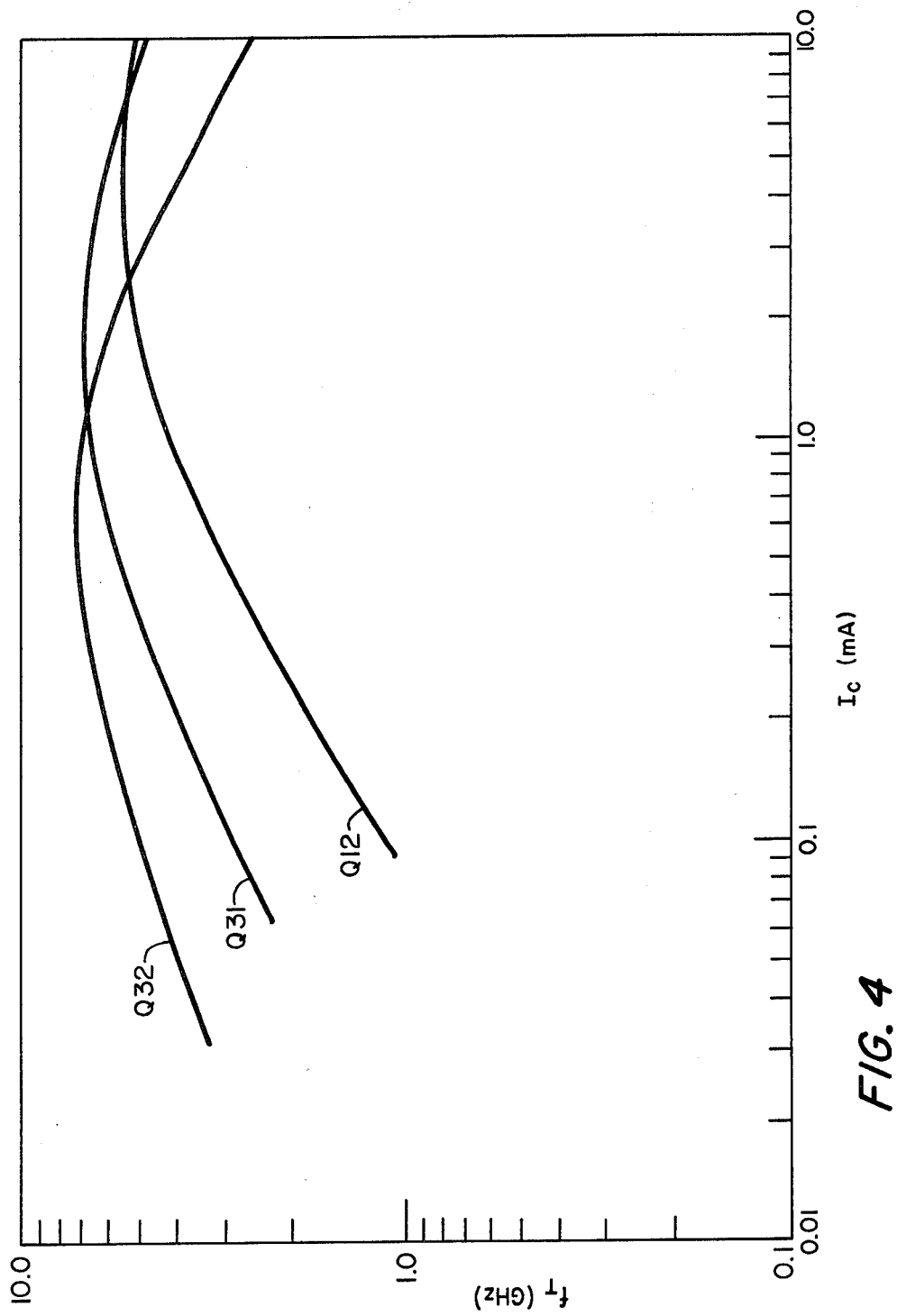
FIG. 4 is a plot of cutoff frequency as a function of collector current for the ion implant process.

The epi layer thickness was $0.8\mu$ and its resistivity for the ion implanted run of FIG. 4 was inadvertantly very low, $\approx 0.15$ $\Omega$ cm, causing increased capacitance and much greater slope at low currents. Peak $f_T$ was correspondingly increased to a higher current by the high collector doping.

The collector-base bias was 2.0 volts. The larger base capacitance resulting from the very low epi has considerably increased the slope of the Q32 curve compared to that of FIG. 3.

PROCESS DETAILS AND ANALYSIS OF DATA

Table I summarizes the electrical characteristics of the diffused devices and gives relevant areas for both the photomasks and the actual devices on the finished wafer. As shown in Table I the Q32 transistor areas on the wafer are about one half of those on the mask. This controlled area reduction is inherent in the process. The 10,000 A ($1\mu$) oxide layer formed in process step *b*. grows under the originally defined nitride pad causing a reduction of about 0.02 mil per side. While this is not significant for the larger geometries it is most important for the Q32 structure. The small emitter area thus obtained, approximately $3\mu^2$, accounts for the very shallow slope observed in the $f_T$ curve at low currents.

In most cases the micro-emitter of the Q32 transistor had a higher peak $f_T$ than the larger geometries on the same wafer. This cannot be fully explained at present, although it has been observed that the collector series resistance is greatly reduced by spreading effects. Using a fictitious radius based on emitter area and the calculations of Foxhall and Lewis, Bell System Technical J. pp. 1608–1617, July 1964, it was possible to obtain a close approximation to the observed ratio of collector resistance for the various structures of FIG. 1. Although the active emitter area is reduced by a factor of twelve, collector series resistance only increases by a factor of four. Therefore part of the observed difference in $f_T$ is due to a reduction in the collector time constant, $T_C = C_{TC} [r_{CS} + r_{SE}]$, where $r_{CS}$ and $r_{SE}$ are the ohmic collector and emitter series resistance.

Contact resistance problems were sometimes encountered with ion implanted emitters and the result was a severe distortion of the $f_T$ curve. In addition, deviations in the photolithography process can cause a sizable difference in the area of the Q32 emitter. Because of the factors just mentioned the degree of peak $f_T$ advantage is not precisely defined at present.

Another distinction of the micro-emitter of transistor Q32 is that the rate of $f_T$ falloff versus current is less than that of the other structures. This phenomenon is believed due to a two dimensional form of the Kirk effect, IRE Trans. Electron Devices, Vol. ED-9, pp. 164–174, March 1962. One dimensional spreading has been shown by Kumar et al, IEEE Transactions on Electron Devices, Vol. ED-22, pp. 51–60, February 1975. to be dominant mode of $f_T$ falloff for most transistors. However the micro-emitter is approaching a point source of current and an extension of Kirk's theory would probably show an effective emitter area larger than the metallurgical one. As shown in Table I, the onset of the Kirk effect which is marked by $f_T$ peak is consistant with the true emitter area on the wafer, and occurs at about the value of collector current predicted by one dimensional base widening.

TABLE I

| Pattern # | Q32 | Q31 | Q22 | Q12 |
|---|---|---|---|---|
| Emitter | | | | |
| Mask dimension, mils | .1 × .1 | .1 × .3 | .1 × .6 | .1 × .6 |

TABLE I-continued

| Pattern # | Q32 | Q31 | Q22 | Q12 |
|---|---|---|---|---|
| Wafer dimensions, mils | .06 × .08 | .08 × 0.28 | .08 × 0.58 | .1 × .6 |
| Area ratio | 1.0 | 4.7 | 9.7 | 12.5 |
| Capacitance, picofarads* | 0.007 | .030 | .064 | 0.100 |
| $f_T$ peak, mA | 0.25 | 1.20 | 2.50 | 3.30 |
| Base | | | | |
| Mask dimensions, mils | .10 × .35 | .30 × .35 | .60 × .35 | .80 × .50 |
| Wafer dimensions, mils | .06 × .31 | .26 × .31 | .56 × .31 | .80 × .50 |
| Area ratio | 1.0 | 4.3 | 9.3 | 21.5 |
| Capacitance, picofarads* | 0.005 | .021 | .045 | 0.104 |
| Electrical Parameters | | | | |
| hFE at 1 mA | 40 | 30 | 25 | 24 |
| $BV_{CEO}$, volts | 9 | 10 | 10 | 11 |
| $BV_{CES}$, volts | 23 | 22 | 21 | 20 |
| $BV_{EBO}$, volts | 5 | 5 | 5 | 5 |
| $f_T$ peak, GHz | 3.5 | 2.0 | 1.9 | 1.6 |

*calculated

What is claimed is:

1. A transistor having high $f_T$ at low collector current, and a low rate of falloff at high collector current comprising
   a collector,
   a base having its minimum dimension no greater than 0.1 mil contained in said collector, said base having silicon dioxide walls forming the boundary of its periphery,
   an emitter on one end of said base,
   said emitter having a dimension along the maximum dimension of said base no greater than 0.1 mil.
   said emitter having one edge and its bottom area in contact with said base and its remaining three edges in contact with said base silicon dioxide walls,
   a base contact region on said base separated from said emitter.

2. The transistor of claim 1 wherein
   said base has a maximum dimension sufficient to allow said emitter and said base contact to be on said base while retaining a region of said base between said emitter and said base contact.

3. The transistor of claim 2 wherein
   said maximum base dimension is 0.35 mil.

* * * * *